(12) United States Patent
Zhang et al.

(10) Patent No.: US 11,380,382 B2
(45) Date of Patent: Jul. 5, 2022

(54) REFRESH LOGIC CIRCUIT LAYOUT HAVING AGGRESSOR DETECTOR CIRCUIT SAMPLING CIRCUIT AND ROW HAMMER REFRESH CONTROL CIRCUIT

(71) Applicant: MICRON TECHNOLOGY, INC., Boise, ID (US)

(72) Inventors: Yu Zhang, Shanghai (CN); Liang Li, Shanghai (CN); Jun Wu, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/997,766

(22) Filed: Aug. 19, 2020

(65) Prior Publication Data

US 2022/0059153 A1 Feb. 24, 2022

(51) Int. Cl.
*G11C 11/406* (2006.01)

(52) U.S. Cl.
CPC .................................. *G11C 11/406* (2013.01)

(58) Field of Classification Search
CPC ............ G11C 11/406; G11C 11/40615; G11C 11/40618
USPC ....................................................... 365/222
See application file for complete search history.

(56) References Cited

U.S. PATENT DOCUMENTS

| | | | |
|---|---|---|---|
| 5,299,159 A | 3/1994 | Balistreri et al. | |
| 5,654,929 A | 8/1997 | Mote, Jr. | |
| 5,699,297 A | 12/1997 | Yamazaki et al. | |
| 5,867,442 A | 2/1999 | Kim et al. | |
| 5,933,377 A | 8/1999 | Hidaka | |
| 5,943,283 A | 8/1999 | Wong et al. | |
| 5,956,288 A | 9/1999 | Bermingham et al. | |
| 5,959,923 A | 9/1999 | Matteson et al. | |
| 5,970,507 A | 10/1999 | Kato et al. | |
| 5,999,471 A | 12/1999 | Choi | |
| 6,002,629 A | 12/1999 | Kim et al. | |
| 6,011,734 A | 1/2000 | Pappert | |
| 6,061,290 A | 5/2000 | Shirley | |
| 6,064,621 A | 5/2000 | Tanizaki et al. | |
| 6,212,118 B1 | 4/2001 | Fujita | |
| 6,306,721 B1 | 10/2001 | Teo et al. | |
| 6,310,806 B1 | 10/2001 | Higashi et al. | |
| 6,310,814 B1 | 10/2001 | Hampel et al. | |

(Continued)

FOREIGN PATENT DOCUMENTS

| | | |
|---|---|---|
| CN | 101038785 A | 9/2007 |
| CN | 101067972 A | 11/2007 |

(Continued)

OTHER PUBLICATIONS

U.S. Appl. No. 16/432,604 titled "Apparatuses and Methods for Staggered Timing of Skipped Refresh Operations" filed Jun. 5, 2019, pp. all.

(Continued)

*Primary Examiner* — Connie C Yoha
(74) *Attorney, Agent, or Firm* — Dorsey & Whitney LLP

(57) ABSTRACT

Embodiments of the disclosure are drawn to apparatuses, systems, and methods for providing refresh logic, such as row hammer refresh circuitry, in a location on a memory die apart from a bank logic region of the memory die. In some examples, at least some of the components of the row hammer refresh circuitry may be shared between banks of the memory.

20 Claims, 5 Drawing Sheets

(56) References Cited

U.S. PATENT DOCUMENTS

| | | |
|---|---|---|
| 6,363,024 B1 | 3/2002 | Fibranz |
| 6,392,952 B1 | 5/2002 | Chen et al. |
| 6,424,582 B1 | 7/2002 | Ooishi |
| 6,434,064 B2 | 8/2002 | Nagai |
| 6,452,868 B1 | 9/2002 | Fister |
| 6,515,928 B2 | 2/2003 | Sato et al. |
| 6,535,950 B1 | 3/2003 | Funyu et al. |
| 6,567,340 B1 | 5/2003 | Nataraj et al. |
| 6,950,364 B2 | 9/2005 | Kim |
| 7,002,868 B2 | 2/2006 | Takahashi |
| 7,057,960 B1 | 6/2006 | Fiscus et al. |
| 7,082,070 B2 | 7/2006 | Hong |
| 7,187,607 B2 | 3/2007 | Koshikawa et al. |
| 7,203,113 B2 | 4/2007 | Takahashi et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,444,577 B2 | 10/2008 | Best et al. |
| 7,551,502 B2 | 6/2009 | Dono et al. |
| 7,565,479 B2 | 7/2009 | Best et al. |
| 7,692,993 B2 | 4/2010 | Iida et al. |
| 7,830,742 B2 | 11/2010 | Han |
| 8,174,921 B2 | 5/2012 | Kim et al. |
| 8,400,805 B2 | 3/2013 | Yoko |
| 8,572,423 B1 | 10/2013 | Isachar et al. |
| 8,625,360 B2 | 1/2014 | Iwamoto et al. |
| 8,681,578 B2 | 3/2014 | Narui |
| 8,756,368 B2 | 6/2014 | Best et al. |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,076,499 B2 | 7/2015 | Schoenborn et al. |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,137 B2 | 11/2015 | Kim et al. |
| 9,190,139 B2 | 11/2015 | Jung et al. |
| 9,236,110 B2 | 1/2016 | Bains et al. |
| 9,251,885 B2 | 2/2016 | Greenfield et al. |
| 9,286,964 B2 | 3/2016 | Halbert et al. |
| 9,299,400 B2 | 3/2016 | Bains et al. |
| 9,311,984 B1 | 4/2016 | Hong et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,390,782 B2 | 7/2016 | Best et al. |
| 9,396,786 B2 | 7/2016 | Yoon et al. |
| 9,406,358 B1 | 8/2016 | Lee |
| 9,412,432 B2 | 8/2016 | Narui et al. |
| 9,418,723 B2 | 8/2016 | Chishti et al. |
| 9,424,907 B2 | 8/2016 | Fujishiro |
| 9,484,079 B2 | 11/2016 | Lee |
| 9,514,850 B2 | 12/2016 | Kim |
| 9,570,143 B2 | 2/2017 | Lim et al. |
| 9,570,201 B2 | 2/2017 | Morgan et al. |
| 9,646,672 B1 | 5/2017 | Kim et al. |
| 9,653,139 B1 | 5/2017 | Park |
| 9,672,889 B2 | 6/2017 | Lee et al. |
| 9,685,240 B1 | 6/2017 | Park |
| 9,691,466 B1 | 6/2017 | Kim |
| 9,697,913 B1 | 7/2017 | Mariani et al. |
| 9,734,887 B1 | 8/2017 | Tavva |
| 9,741,409 B2 | 8/2017 | Jones et al. |
| 9,741,447 B2 | 8/2017 | Akamatsu |
| 9,747,971 B2 | 8/2017 | Bains et al. |
| 9,761,297 B1 | 9/2017 | Tomishima |
| 9,786,351 B2 | 10/2017 | Lee et al. |
| 9,799,391 B1 | 10/2017 | Wei |
| 9,805,782 B1 | 10/2017 | Liou |
| 9,805,783 B2 | 10/2017 | Ito et al. |
| 9,812,185 B2 | 11/2017 | Fisch et al. |
| 9,818,469 B1 | 11/2017 | Kim et al. |
| 9,831,003 B2 | 11/2017 | Sohn et al. |
| 9,865,326 B2 | 1/2018 | Bains et al. |
| 9,865,328 B1 | 1/2018 | Desimone et al. |
| 9,922,694 B2 | 3/2018 | Akamatsu |
| 9,934,143 B2 | 4/2018 | Bains et al. |
| 9,953,696 B2 | 4/2018 | Kim |
| 9,978,430 B2 | 5/2018 | Seo et al. |
| 10,020,045 B2 | 7/2018 | Riho |
| 10,020,046 B1 | 7/2018 | Uemura |
| 10,032,501 B2 | 7/2018 | Ito et al. |
| 10,049,716 B2 | 8/2018 | Proebsting |
| 10,083,737 B2 | 9/2018 | Bains et al. |
| 10,090,038 B2 | 10/2018 | Shin |
| 10,134,461 B2 | 11/2018 | Bell et al. |
| 10,141,042 B1 | 11/2018 | Richter |
| 10,147,472 B2 | 12/2018 | Jones et al. |
| 10,153,031 B2 | 12/2018 | Akamatsu |
| 10,170,174 B1 | 1/2019 | Ito et al. |
| 10,192,608 B2 | 1/2019 | Morgan |
| 10,210,925 B2 | 2/2019 | Bains et al. |
| 10,297,305 B1 | 5/2019 | Moon et al. |
| 10,297,307 B1 | 5/2019 | Raad et al. |
| 10,339,994 B2 | 7/2019 | Ito et al. |
| 10,381,327 B2 | 8/2019 | Ramachandra et al. |
| 10,446,256 B2 | 10/2019 | Ong et al. |
| 10,468,076 B1 | 11/2019 | He et al. |
| 10,490,250 B1 | 11/2019 | Ito et al. |
| 10,490,251 B2 | 11/2019 | Wolff |
| 10,504,577 B1 | 12/2019 | Alzheimer |
| 10,510,396 B1 | 12/2019 | Notani et al. |
| 10,572,377 B1 | 2/2020 | Zhang et al. |
| 10,573,370 B2 | 2/2020 | Ito et al. |
| 10,607,679 B2 | 3/2020 | Nakaoka |
| 10,685,696 B2 | 6/2020 | Brown et al. |
| 10,699,796 B2 | 6/2020 | Benedict et al. |
| 10,790,005 B1 | 9/2020 | He et al. |
| 10,825,505 B2 | 11/2020 | Rehmeyer |
| 10,832,792 B1 | 11/2020 | Penney et al. |
| 10,930,335 B2 | 2/2021 | Bell et al. |
| 10,943,636 B1 | 3/2021 | Wu et al. |
| 10,950,289 B2 | 3/2021 | Ito et al. |
| 10,957,377 B2 | 3/2021 | Noguchi |
| 10,964,378 B2 | 3/2021 | Ayyapureddi et al. |
| 10,978,132 B2 | 4/2021 | Rehmeyer et al. |
| 11,017,833 B2 | 5/2021 | Wu et al. |
| 11,069,393 B2 | 7/2021 | Cowles et al. |
| 11,081,160 B2 * | 8/2021 | Ito .................. G11C 11/40615 |
| 11,222,683 B2 | 1/2022 | Rehmeyer |
| 11,222,686 B1 | 1/2022 | Noguchi |
| 11,227,649 B2 | 1/2022 | Meier et al. |
| 11,264,079 B1 | 3/2022 | Roberts |
| 2001/0008498 A1 | 7/2001 | Ooishi |
| 2002/0026613 A1 | 2/2002 | Niiro |
| 2002/0181301 A1 | 12/2002 | Takahashi et al. |
| 2002/0191467 A1 | 12/2002 | Matsumoto et al. |
| 2003/0026161 A1 | 2/2003 | Yamaguchi et al. |
| 2003/0063512 A1 | 4/2003 | Takahashi et al. |
| 2003/0067825 A1 | 4/2003 | Shimano et al. |
| 2003/0081483 A1 | 5/2003 | De Paor et al. |
| 2003/0123301 A1 | 7/2003 | Jang et al. |
| 2003/0161208 A1 | 8/2003 | Nakashima et al. |
| 2003/0193829 A1 | 10/2003 | Morgan et al. |
| 2003/0231540 A1 | 12/2003 | Lazar et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0024955 A1 | 2/2004 | Patel |
| 2004/0114446 A1 | 6/2004 | Takahashi et al. |
| 2004/0130959 A1 | 7/2004 | Kawaguchi |
| 2004/0184323 A1 | 9/2004 | Mori et al. |
| 2004/0218431 A1 | 11/2004 | Chung et al. |
| 2005/0002268 A1 | 1/2005 | Otsuka et al. |
| 2005/0041502 A1 | 2/2005 | Perner |
| 2005/0105362 A1 | 5/2005 | Choi et al. |
| 2005/0198460 A1 | 5/2005 | David |
| 2005/0213408 A1 | 9/2005 | Shieh |
| 2005/0243627 A1 | 11/2005 | Lee et al. |
| 2005/0265104 A1 | 12/2005 | Remaklus et al. |
| 2006/0018174 A1 | 1/2006 | Park et al. |

(56) References Cited

U.S. PATENT DOCUMENTS

| | | |
|---|---|---|
| 2006/0083099 A1 | 4/2006 | Bae et al. |
| 2006/0087903 A1 | 4/2006 | Riho et al. |
| 2006/0104139 A1 | 5/2006 | Hur et al. |
| 2006/0176744 A1 | 8/2006 | Stave |
| 2006/0215474 A1 | 9/2006 | Hokenmaier |
| 2006/0233012 A1 | 10/2006 | Sekiguchi et al. |
| 2006/0262616 A1 | 11/2006 | Chen |
| 2006/0262617 A1 | 11/2006 | Lee |
| 2006/0268643 A1 | 11/2006 | Schreck et al. |
| 2007/0002651 A1 | 1/2007 | Lee |
| 2007/0008799 A1 | 1/2007 | Dono et al. |
| 2007/0014175 A1 | 1/2007 | Min et al. |
| 2007/0028068 A1 | 2/2007 | Golding et al. |
| 2007/0030746 A1 | 2/2007 | Best et al. |
| 2007/0033339 A1 | 2/2007 | Best et al. |
| 2007/0147154 A1 | 6/2007 | Lee |
| 2007/0237016 A1 | 10/2007 | Miyamoto et al. |
| 2007/0263442 A1 | 11/2007 | Cornwell et al. |
| 2007/0297252 A1 | 12/2007 | Singh |
| 2008/0028260 A1 | 1/2008 | Oyagi et al. |
| 2008/0031068 A1 | 2/2008 | Yoo et al. |
| 2008/0126893 A1 | 5/2008 | Harrand et al. |
| 2008/0130394 A1 | 6/2008 | Dono et al. |
| 2008/0181048 A1 | 7/2008 | Han |
| 2008/0212386 A1 | 9/2008 | Riho |
| 2008/0224742 A1 | 9/2008 | Pomichter |
| 2008/0253212 A1 | 10/2008 | Iida et al. |
| 2008/0253213 A1 | 10/2008 | Sato et al. |
| 2008/0266990 A1 | 10/2008 | Loeffler |
| 2008/0270683 A1 | 10/2008 | Barth et al. |
| 2008/0306723 A1 | 12/2008 | De Ambroggi et al. |
| 2008/0316845 A1 | 12/2008 | Wang et al. |
| 2009/0021999 A1 | 1/2009 | Tanimura et al. |
| 2009/0052264 A1 | 2/2009 | Hong et al. |
| 2009/0059641 A1 | 3/2009 | Jeddeloh |
| 2009/0073760 A1 | 3/2009 | Betser et al. |
| 2009/0161468 A1 | 6/2009 | Fujioka |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0228739 A1 | 9/2009 | Cohen et al. |
| 2009/0251971 A1 | 10/2009 | Futatsuyama |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0061153 A1 | 3/2010 | Yen et al. |
| 2010/0074042 A1 | 3/2010 | Fukuda et al. |
| 2010/0097870 A1 | 4/2010 | Kim et al. |
| 2010/0110809 A1 | 5/2010 | Kobayashi et al. |
| 2010/0110810 A1 | 5/2010 | Kobayashi |
| 2010/0124138 A1 | 5/2010 | Lee et al. |
| 2010/0128547 A1 | 5/2010 | Kagami |
| 2010/0131812 A1 | 5/2010 | Mohammad |
| 2010/0141309 A1 | 6/2010 | Lee |
| 2010/0157693 A1 | 6/2010 | Iwai et al. |
| 2010/0182862 A1 | 7/2010 | Teramoto |
| 2010/0182863 A1 | 7/2010 | Fukiage |
| 2010/0329069 A1 | 12/2010 | Ito et al. |
| 2011/0026290 A1 | 2/2011 | Noda et al. |
| 2011/0055495 A1 | 3/2011 | Remaklus, Jr. |
| 2011/0069572 A1 | 3/2011 | Lee et al. |
| 2011/0122987 A1 | 5/2011 | Neyer |
| 2011/0134715 A1 | 6/2011 | Norman |
| 2011/0216614 A1 | 9/2011 | Hosoe |
| 2011/0225355 A1 | 9/2011 | Kajigaya |
| 2011/0299352 A1 | 12/2011 | Fujishiro et al. |
| 2011/0310648 A1 | 12/2011 | Iwamoto et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0155173 A1 | 6/2012 | Lee et al. |
| 2012/0155206 A1 | 6/2012 | Kodama et al. |
| 2012/0213021 A1 | 8/2012 | Riho et al. |
| 2012/0254472 A1 | 10/2012 | Ware et al. |
| 2012/0287727 A1 | 11/2012 | Wang |
| 2012/0307582 A1 | 12/2012 | Marumoto et al. |
| 2012/0327734 A1 | 12/2012 | Sato |
| 2013/0003467 A1 | 1/2013 | Klein |
| 2013/0003477 A1 | 1/2013 | Park et al. |
| 2013/0028034 A1 | 1/2013 | Fujisawa |
| 2013/0051157 A1 | 2/2013 | Park |
| 2013/0051171 A1 | 2/2013 | Porter et al. |
| 2013/0077423 A1 | 3/2013 | Lee |
| 2013/0173971 A1 | 7/2013 | Zimmerman |
| 2013/0254475 A1 | 9/2013 | Perego et al. |
| 2013/0279284 A1 | 10/2013 | Jeong |
| 2014/0006700 A1 | 1/2014 | Schaefer et al. |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0016422 A1 | 1/2014 | Kim et al. |
| 2014/0022858 A1 | 1/2014 | Chen et al. |
| 2014/0043888 A1 | 2/2014 | Chen et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0089576 A1 | 3/2014 | Bains et al. |
| 2014/0089758 A1 | 3/2014 | Kwok et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0143473 A1 | 5/2014 | Kim et al. |
| 2014/0169114 A1* | 6/2014 | Oh ................ G11C 11/40611 365/222 |
| 2014/0177370 A1 | 6/2014 | Halbert et al. |
| 2014/0181453 A1 | 6/2014 | Jayasena et al. |
| 2014/0185403 A1 | 7/2014 | Lai |
| 2014/0189228 A1 | 7/2014 | Greenfield et al. |
| 2014/0219042 A1 | 8/2014 | Yu et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0281206 A1 | 9/2014 | Crawford et al. |
| 2014/0281207 A1 | 9/2014 | Mandava et al. |
| 2014/0293725 A1 | 10/2014 | Best et al. |
| 2014/0321226 A1 | 10/2014 | Pyeon |
| 2015/0016203 A1 | 1/2015 | Sriramagiri et al. |
| 2015/0049566 A1 | 2/2015 | Lee et al. |
| 2015/0049567 A1 | 2/2015 | Chi |
| 2015/0055420 A1 | 2/2015 | Bell et al. |
| 2015/0078112 A1 | 3/2015 | Huang |
| 2015/0085564 A1 | 3/2015 | Yoon et al. |
| 2015/0089326 A1 | 3/2015 | Joo et al. |
| 2015/0092508 A1 | 4/2015 | Bains |
| 2015/0109871 A1 | 4/2015 | Bains et al. |
| 2015/0120999 A1 | 4/2015 | Kim et al. |
| 2015/0134897 A1 | 5/2015 | Sriramagiri et al. |
| 2015/0155025 A1 | 6/2015 | Lee et al. |
| 2015/0162064 A1 | 6/2015 | Oh et al. |
| 2015/0162067 A1 | 6/2015 | Kim et al. |
| 2015/0170728 A1 | 6/2015 | Jung et al. |
| 2015/0199126 A1 | 7/2015 | Jayasena et al. |
| 2015/0206572 A1 | 7/2015 | Lim et al. |
| 2015/0213872 A1 | 7/2015 | Mazumder et al. |
| 2015/0243339 A1 | 8/2015 | Bell et al. |
| 2015/0255140 A1 | 9/2015 | Song |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2015/0380073 A1 | 12/2015 | Joo et al. |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |
| 2016/0042782 A1 | 2/2016 | Narui et al. |
| 2016/0070483 A1 | 3/2016 | Yoon et al. |
| 2016/0078846 A1 | 3/2016 | Liu et al. |
| 2016/0078911 A1 | 3/2016 | Fujiwara et al. |
| 2016/0086649 A1 | 3/2016 | Hong et al. |
| 2016/0093402 A1 | 3/2016 | Kitagawa et al. |
| 2016/0125931 A1 | 5/2016 | Doo et al. |

(56) References Cited

U.S. PATENT DOCUMENTS

| | | |
|---|---|---|
| 2016/0133314 A1 | 5/2016 | Hwang et al. |
| 2016/0155491 A1 | 6/2016 | Roberts et al. |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0225433 A1 | 8/2016 | Bains et al. |
| 2016/0336060 A1 | 11/2016 | Shin |
| 2016/0343423 A1 | 11/2016 | Shido |
| 2017/0011792 A1 | 1/2017 | Oh et al. |
| 2017/0052722 A1 | 2/2017 | Ware et al. |
| 2017/0076779 A1 | 3/2017 | Bains et al. |
| 2017/0092350 A1 | 3/2017 | Halbert et al. |
| 2017/0111792 A1 | 4/2017 | Correia Fernandes et al. |
| 2017/0133085 A1 | 5/2017 | Kim et al. |
| 2017/0133108 A1 | 5/2017 | Lee et al. |
| 2017/0140807 A1 | 5/2017 | Sun et al. |
| 2017/0140810 A1 | 5/2017 | Choi et al. |
| 2017/0140811 A1 | 5/2017 | Joo |
| 2017/0146598 A1 | 5/2017 | Kim et al. |
| 2017/0148504 A1 | 5/2017 | Saifuddin et al. |
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0269861 A1 | 9/2017 | Lu et al. |
| 2017/0287547 A1 | 10/2017 | Ito et al. |
| 2017/0323675 A1 | 11/2017 | Jones et al. |
| 2017/0345482 A1 | 11/2017 | Balakrishnan |
| 2017/0352404 A1 | 12/2017 | Lee et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0025773 A1 | 1/2018 | Bains et al. |
| 2018/0033479 A1 | 2/2018 | Lea et al. |
| 2018/0047110 A1 | 2/2018 | Blackman et al. |
| 2018/0061476 A1 | 3/2018 | Kim |
| 2018/0061483 A1 | 3/2018 | Morgan |
| 2018/0061485 A1 | 3/2018 | Joo |
| 2018/0075927 A1 | 3/2018 | Jeong et al. |
| 2018/0082737 A1 | 3/2018 | Lee |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0108401 A1 | 4/2018 | Choi et al. |
| 2018/0114561 A1 | 4/2018 | Fisch et al. |
| 2018/0114565 A1 | 4/2018 | Lee |
| 2018/0122454 A1 | 5/2018 | Lee et al. |
| 2018/0130506 A1 | 5/2018 | Kang et al. |
| 2018/0137005 A1 | 5/2018 | Wu et al. |
| 2018/0158504 A1 | 6/2018 | Akamatsu |
| 2018/0158507 A1 | 6/2018 | Bang |
| 2018/0182445 A1 | 6/2018 | Lee et al. |
| 2018/0190340 A1 | 7/2018 | Kim et al. |
| 2018/0218767 A1 | 8/2018 | Wolff |
| 2018/0226119 A1 | 8/2018 | Kim et al. |
| 2018/0233197 A1 | 8/2018 | Laurent |
| 2018/0240511 A1 | 8/2018 | Yoshida et al. |
| 2018/0247876 A1 | 8/2018 | Kim et al. |
| 2018/0254078 A1 | 9/2018 | We et al. |
| 2018/0261268 A1 | 9/2018 | Hyun et al. |
| 2018/0276150 A1 | 9/2018 | Eckert et al. |
| 2018/0285007 A1 | 10/2018 | Franklin et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0065087 A1 | 2/2019 | Li et al. |
| 2019/0066759 A1 | 2/2019 | Nale |
| 2019/0066766 A1 | 2/2019 | Lee |
| 2019/0088315 A1 | 3/2019 | Saenz et al. |
| 2019/0088316 A1 | 3/2019 | Inuzuka et al. |
| 2019/0103147 A1 | 4/2019 | Jones et al. |
| 2019/0115069 A1 | 4/2019 | Lai |
| 2019/0122723 A1 | 4/2019 | Ito et al. |
| 2019/0129651 A1 | 5/2019 | Wuu et al. |
| 2019/0130960 A1 | 5/2019 | Kim |
| 2019/0130961 A1 | 5/2019 | Bell et al. |
| 2019/0147964 A1 | 5/2019 | Yun et al. |
| 2019/0161341 A1 | 5/2019 | Howe |
| 2019/0190341 A1 | 6/2019 | Beisele et al. |
| 2019/0196730 A1 | 6/2019 | Imran |
| 2019/0198078 A1 | 6/2019 | Hoang et al. |
| 2019/0198099 A1 | 6/2019 | Mirichigni et al. |
| 2019/0205253 A1 | 7/2019 | Roberts |
| 2019/0228810 A1 | 7/2019 | Jones et al. |
| 2019/0228815 A1 | 7/2019 | Morohashi et al. |
| 2019/0252020 A1 | 8/2019 | Rios et al. |
| 2019/0267077 A1 | 8/2019 | Ito et al. |
| 2019/0279706 A1 | 9/2019 | Kim |
| 2019/0294348 A1 | 9/2019 | Ware et al. |
| 2019/0333573 A1 | 10/2019 | Shin et al. |
| 2019/0347019 A1 | 11/2019 | Shin et al. |
| 2019/0348100 A1 | 11/2019 | Smith et al. |
| 2019/0348102 A1 | 11/2019 | Smith et al. |
| 2019/0348103 A1 | 11/2019 | Jeong et al. |
| 2019/0362774 A1 | 11/2019 | Kuramori et al. |
| 2019/0385661 A1 | 12/2019 | Koo et al. |
| 2019/0385667 A1 | 12/2019 | Morohashi et al. |
| 2019/0385668 A1 | 12/2019 | Fujioka et al. |
| 2019/0385670 A1 | 12/2019 | Notani et al. |
| 2019/0386557 A1 | 12/2019 | Wang et al. |
| 2019/0391760 A1 | 12/2019 | Miura et al. |
| 2019/0392886 A1 | 12/2019 | Cox et al. |
| 2020/0005857 A1 | 1/2020 | Ito et al. |
| 2020/0051616 A1 | 2/2020 | Cho |
| 2020/0075086 A1 | 3/2020 | Hou et al. |
| 2020/0082873 A1 | 3/2020 | Wolff |
| 2020/0126611 A1 | 4/2020 | Riho et al. |
| 2020/0135263 A1 | 4/2020 | Brown et al. |
| 2020/0143871 A1 | 5/2020 | Kim et al. |
| 2020/0176050 A1 | 6/2020 | Ito et al. |
| 2020/0185026 A1 | 6/2020 | Yun et al. |
| 2020/0194056 A1 | 6/2020 | Sakurai et al. |
| 2020/0202921 A1 | 6/2020 | Morohashi et al. |
| 2020/0210278 A1 | 7/2020 | Rooney et al. |
| 2020/0211632 A1 | 7/2020 | Noguchi |
| 2020/0211633 A1 | 7/2020 | Okuma |
| 2020/0211634 A1 | 7/2020 | Ishikawa et al. |
| 2020/0219550 A1 | 7/2020 | Ishikawa et al. |
| 2020/0219555 A1* | 7/2020 | Rehmeyer ........... G11C 11/4087 |
| 2020/0265888 A1 | 8/2020 | Ito et al. |
| 2020/0273517 A1 | 8/2020 | Yamamoto |
| 2020/0273518 A1 | 8/2020 | Raad et al. |
| 2020/0279599 A1 | 9/2020 | Ware et al. |
| 2020/0294569 A1 | 9/2020 | Wu et al. |
| 2020/0294576 A1 | 9/2020 | Brown et al. |
| 2020/0321049 A1 | 10/2020 | Meier et al. |
| 2020/0381040 A1 | 12/2020 | Penney et al. |
| 2020/0388324 A1 | 12/2020 | Rehmeyer et al. |
| 2020/0388325 A1 | 12/2020 | Cowles et al. |
| 2020/0395063 A1 | 12/2020 | Rehmeyer |
| 2021/0057021 A1 | 2/2021 | Wu et al. |
| 2021/0057022 A1 | 2/2021 | Jenkinson et al. |
| 2021/0118491 A1 | 4/2021 | Li et al. |
| 2021/0166752 A1 | 6/2021 | Noguchi |
| 2021/0183433 A1 | 6/2021 | Jenkinson et al. |
| 2021/0183435 A1 | 6/2021 | Meier et al. |
| 2021/0225431 A1 | 7/2021 | Rehmeyer et al. |
| 2021/0304813 A1 | 9/2021 | Cowles et al. |
| 2021/0335411 A1 | 10/2021 | Wu et al. |
| 2022/0059158 A1 | 2/2022 | Wu et al. |

FOREIGN PATENT DOCUMENTS

| | | |
|---|---|---|
| CN | 104350546 A | 2/2012 |
| CN | 106710621 A | 5/2017 |
| CN | 107871516 A | 4/2018 |
| JP | 2005-216429 A | 8/2005 |
| JP | 2011-258259 A | 12/2011 |
| JP | 4911510 B2 | 1/2012 |

(56) References Cited

FOREIGN PATENT DOCUMENTS

| | | | |
|---|---|---|---|
| JP | 2013-004158 A | 1/2013 |
| JP | 6281030 B1 | 1/2018 |
| WO | 2014120477 A1 | 8/2014 |
| WO | 2015030991 A1 | 3/2015 |
| WO | 2017171927 A1 | 10/2017 |
| WO | 2019222960 A1 | 11/2019 |
| WO | 2020010010 A1 | 1/2020 |
| WO | 2020117686 A1 | 6/2020 |
| WO | 2020247163 A1 | 12/2020 |
| WO | 2020247639 A1 | 12/2020 |

OTHER PUBLICATIONS

U.S. Appl. No. 17/226,975, titled "Apparatuses and Methods for Staggered Timing of Skipped Refresh Operations" filed Apr. 19, 2021, pp. all.
U.S. Appl. No. 17/175,485 titled "Apparatuses and Methods for Distributed Targeted Refresh Operations" filed Feb. 12, 2021, pp. all.
U.S. Appl. No. 17/186,913 titled "Apparatuses and Methods for Dynamic Refresh Allocation" filed Feb. 26, 2021, pp. all.
U.S. Appl. No. 17/187,002 titled "Apparatuses and Methods for Staggered Timing of Targeted Refresh Operations" filed Feb. 26, 2021, pp. all.
U.S. Appl. No. 17/324,621 titled "Apparatuses And Methods for Pure-Time, Self-Adopt Sampling For Row Hammer Refresh Sampling" filed May 19, 2021.
U.S. Appl. No. 17/347,957 titled "Apparatuses and Methods for Controlling Steal Rates" filed Jun. 15, 2021.
Application No. PCT/US20/23689, titled "Semiconductor Device Having Cam That Stores Address Signals", dated Mar. 19, 2020, pp. all.
U.S. Appl. No. 16/797,658, titles "Apparatuses and Methods for Controlling Refresh Operations", filed Feb. 21, 2020, pp. all.
U.S. Appl. No. 16/818,981 titled "Apparatuses and Methods for Staggered Timing of Targeted Refresh Operations" filed Mar. 13, 2020, pp. all.
U.S. Appl. No. 16/824,460, titled "Semiconductor Device Performing Row Hammer Refresh Operation", dated Mar. 19, 2020, pp. all.
U.S. Appl. No. 16/025,844, titled "Apparatus and Methods for Triggering Row Hammer Address Sampling", filed Jul. 2, 2018, pp. all.
U.S. Appl. No. 16/783,063, titled "Apparatus and Methods for Triggering Row Hammer Address Sampling", dated Feb. 5, 2020, pp. all.
U.S. Appl. No. 16/805,197, titled "Apparatuses and Methods for Calculating Row Hammer Refresh Addresses in a Semiconductor Device", dated Feb. 28, 2020, pp. all.
U.S. Appl. No. 16/232,837, titled "Apparatuses and Methods for Distributed Targeted Refresh Operations", filed Dec. 26, 2018, pp. all.
U.S. Appl. No. 16/818,989, titled "Semiconductor Device Performing Row Hammer Refresh Operation", dated Mar. 13, 2020, pp. all.
U.S. Appl. No. 16/286,818, titled "Apparatuses and Methods for Managing Row Access Counts", filed Feb. 6, 2019, pp. all.
U.S. Appl. No. 16/286,187 titled "Apparatuses and Methods for Memory Mat Refresh Sequencing" filed Feb. 26, 2019; pp. all.
U.S. Appl. No. 16/084,119, titled "Apparatuses and Methods for Pure-Time, Self Adopt Sampling for Row Hammer Refresh Sampling", filed Sep. 11, 2018, pp. all.
U.S. Appl. No. 16/886,284 titled "Apparatuses and Methods for Access Based Refresh Timing" filed May 28, 2020, pp. all.
U.S. Appl. No. 16/886,284, titled "Apparatuses and Methods for Access Based Refresh Timing", dated May 28, 2020, pp. all.
U.S. Appl. No. 16/358,587, titled "Semiconductor Device Having Cam That Stores Address Signals", dated Mar. 19, 2019, pp. all.
U.S. Appl. No. 16/375,716 titled "Apparatuses and Methods for Staggered Timing of Targeted Refresh Operations" filed Apr. 4, 2019; pp. all.
U.S. Appl. No. 16/411,573 titled "Apparatuses, Systems. and Methods for a Content Addressable Memory Cell" filed May 14, 2019, pp. all.
U.S. Appl. No. 16/428,625 titled "Apparatuses and Methods for Tracking Victim Rows" filed May 31, 2019, pp. all.
U.S. Appl. No. 17/008,396 titled "Apparatuses and Methods for Staggered Timing of Targeted Refresh Operations" filed Aug. 31, 2020; pp. all.
PCT Application No. PCT/US20/32931, titled "Apparatuses and Methods for Controlling Steal Rates", dated May 14. 2020, pp. all.
U S. Appl. No. 16/546,152 titled "Apparatuses and Methods for Analog Row Access Tracking" filed Aug. 20, 2019, pp. all.
U.S. Appl. No. 16/548,027 titled "Apparatuses, Systems, and Methods for Analog Row Access Rate Determination" filed Aug. 22, 2019, pp. all.
U.S. Appl. No. 16/549,942 titled "Apparatuses and Methods for Lossy Row Access Counting" filed Aug. 23, 2019, pp. all.
U.S. Appl. No. 16/788,657, titled "Semiconductor Device Performing Row Hammer Refresh Operation", filed Feb. 12, 2020, pp. all.
U.S. Appl. No. 15/881,256 entitled 'Apparatuses and Methods for Detecting a Row Hammer Attack With a Bandpass Filter' filed Jan. 26, 2018, pp. all.
U.S. Appl. No. 16/425,525 titled "Apparatuses And Methods For Tracking All Row Accesses" filed May 29, 2019, pp. all.
U.S. Appl. No. 16/427,105 titled "Apparatuses And Methods For Priority Targeted Refresh Operations" filed May 30, 2019, pp. all.
U.S. Appl. No. 16/427,140 titled "Apparatuses And Methods For Tracking Row Access Counts Between Multiple Register Stacks" filed May 30, 2019, pp. all.
U.S. Appl. No. 16/437,811 titled "Apparatuses, Systems, And Methods For Determining Extremum Numerical Values" filed Jun. 11, 2019, pp. all.
U.S. Appl. No. 16/513,400 titled "Apparatuses and Methods for Tracking Row Accesses" filed Jul. 16, 2019, pp. all.
U.S. Appl. No. 16/537,981 titled "Apparatuses and Methods for Controlling Targeted Refresh Rates" filed Aug. 12, 2019, pp. all.
U.S. Appl. No. 16/665,110 titled "Apparatuses and Methods for Dynamic Targeted Refresh Steals" filed Oct. 16, 2019, pp. all.
U.S. Appl. No. 17/095,978 titled "Apparatuses and Methods for Controlling Refresh Timing" filed Nov. 12. 2020, pp. all.
U.S. Appl. No. 15/789,897, entitled "Apparatus and Methods for Refreshing Memory", filed Oct. 20, 2017; pp. all.
U.S. Appl. No. 15/796,340, entitled: "Apparatus and Methods for Refreshing Memory" filed on Oct. 27, 2017; pp. all.
U.S. Appl. No. 16/012,679, titled "Apparatuses and Methods for Multiple Row Hammer Refresh Address Sequences", filed Jun. 19, 2018, pp. all.
U.S. Appl. No. 16/020,863, titled "Semiconductor Device", filed Jun. 27, 2018, pp. all.
U.S. Appl. No. 16/112,471 titled "Apparatuses and Methods for Controlling Refresh Operations" filed Aug. 24, 2018, pp. all.
U.S. Appl. No. 16/160,801, titled "Apparatuses and Methods for Selective Row Refreshes" filed Oct. 15, 2018, pp all.
U.S. Appl. No. 16/176,932, titled "Apparatuses and Methods for Access Based Refresh Timing", filed Oct. 31, 2018, pp. all.
U.S. Appl. No. 16/208,217, titled "Semiconductor Device Performing Row Hammer Refresh Operation", filed Dec. 3, 2018, pp. all.
U.S. Appl. No. 16/230,300, titled "Apparatuses and Methods for Staggered Timing of Targeted Refresh Operations" filed Dec. 21, 2018, pp. all.
U.S. Appl. No. 16/231,327 titled "Apparatuses and Methods for Selective Row Refreshes", filed Dec. 21, 2018, pp. all.
U.S. Appl. No. 16/237,291, titled "Apparatus and Methods for Refreshing Memory", filed Dec. 31, 2018, pp. all.
U.S. Appl. No. 16/290,730, titled "Semiconductor Device Performing Row Hammer Refresh Operation", filed Mar. 1, 2019, pp. all.
U.S. Appl. No. 16/374,623, titled "Semiconductor Device Performing Row Hammer Refresh Operation", filed Apr. 3, 2019, pp. all.
U.S. Appl. No. 16/411,698 title "Semiconductor Device" filed May 14, 2019, pp. all.
U.S. Appl. No. 16/427,330 titled "Apparatuses and Methods for Storing Victim Row Data" filed May 30, 2019, pp. all.

(56) References Cited

OTHER PUBLICATIONS

U.S. Appl. No. 16/549,411 titled "Apparatuses and Methods for Controlling Steal Rates" filed Jun. 4, 2019, pp. all.
U.S. Appl. No. 16/549,411 titled "Apparatuses and Methods for Dynamic Refresh Allocation" filed Aug. 23. 2019, pp. all.
U.S. Appl. No. 16/682,606, titled "Apparatuses And Methods For Distributing Row Hammer Refresh Events Across A Memory Device ", filed Nov. 13, 2019, pp. all.
U.S. Appl. No. 15/876,566 entitled 'Apparatuses and Methods for Calculating Row Hammer Refresh Addresses in a Semiconductor Device' filed Jan. 22, 2018, pp. all.
U.S. Appl. No. 15/656,084, titled "Apparatuses And Methods For Targeted Refreshing Of Memory", filed Jul. 21, 2017, pp. all.
U.S. Appl. No. 16/459,520 titled "Apparatuses and Methods for Monitoring Word Line Accesses", filed Jul. 1, 2019, pp. all.
PCT Application No. PCT/US18/55821 "Apparatus and Methods for Refreshing Memory" filed Oct. 15, 2018, pp. all.
U.S. Appl. No. 15/715,846, entitled "Semiconductor Device", filed Sep. 26, 2017, pp. all.
U.S. Appl. No. 16/888,993, entitled "Apparatuses and Methods for Controlling Refresh Operations", filed Feb. 5, 2018, pp. all.
U.S. Appl. No. 16/190,627 titled "Apparatuses and Methods for Targeted Refreshing of Memory" filed Nov. 14. 2018, pp. all.
U.S. Appl. No. 17/030,018, titled "Apparatuses and Methods for Controlling Refresh Operations", filed Sep. 23, 2020, pp. all.
U.S. Appl. No. 15/281,818, entitled: "Semiconductor Device" filed Sep. 30, 2016; pp. all.
Kim, et al., "Flipping Bits in MemoryWithout Accessing Them: An Experimental Study of DRAM Disturbance Errors", IEEE, Jun. 2014, 12 pgs.
U.S. Appl. No. 17/654,035, titled "Apparatuses and Methods for Dynamic Targeted Refresh Steals", filed Mar. 8, 2022; pp. all pages of application as filed.
U.S. Appl. No. 16/994,338 titled "Apparatuses, Systems, and Methods for Memory Directed Access Pause" filed Aug. 14, 2020, pp. all.
U.S. Appl. No. 16/997,659 titled "Apparatuses, Systems, and Methods for Refresh Modes" filed Aug. 19, 2020; pp. all.
U.S. Appl. No. 17/127,654 titled "Apparatuses and Methods for Row Hammer Based Cache Lockdown" filed Dec. 18, 2020, pp. all.
U.S. Appl. No. 17/662,733, titled "Apparatuses, Systems, and Methods for Identifying Victim Rows in a Memorydevice Which Cannot Be Simultaneously Refreshed" filed May 10, 2022, pp. all pages of application as filed.
U.S. Appl. No. 17/731,529, titled "Apparatuses and Methods for Access Based Refresh Operations"; filed Apr. 28, 2022; pp. all pages of the application as filed.
U.S. Appl. No. 17/731,645, titled "Apparatuses and Methods for Access Based Targeted Refresh Operations", filed Apr. 28, 2022; pp. all pages of application as filed.

* cited by examiner

REFRESH LOGIC CIRCUIT LAYOUT HAVING AGGRESSOR DETECTOR CIRCUIT SAMPLING CIRCUIT AND ROW HAMMER REFRESH CONTROL CIRCUIT

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

As memory components have decreased in size, the density of memory cells has greatly increased. Repeated access to a particular memory cell or group of memory cells (often referred to as a 'row hammer') may cause an increased rate of data degradation in nearby memory cells. It may be desirable to identify and refresh memory cells affected by the row hammer. However, the circuitry for ameliorating row hammer effects may require significant layout area on a die including the memory.

DETAILED DESCRIPTION

Figure 1:
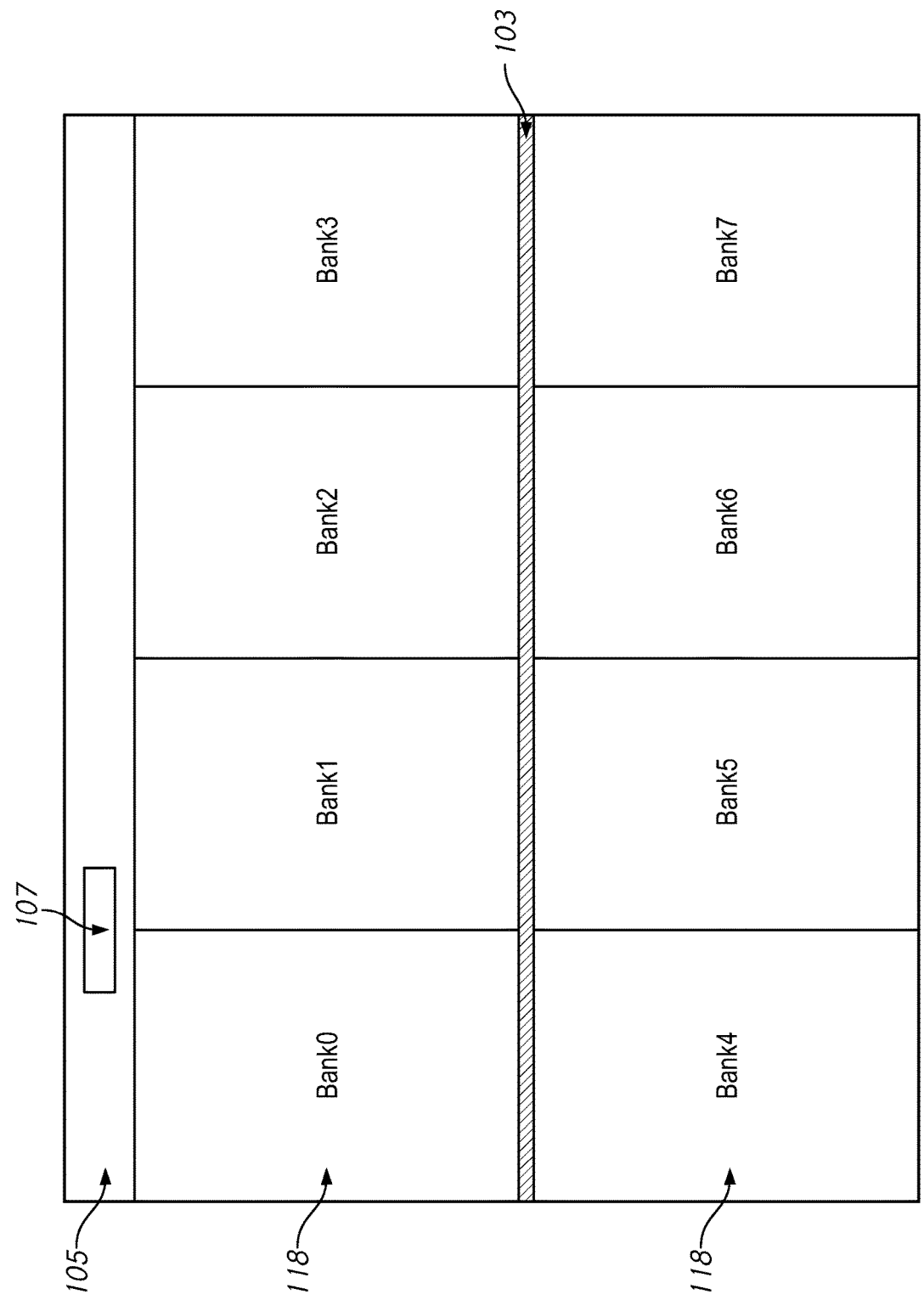
FIG. 1 is a layout diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a volatile memory device may be stored in memory cells (e.g., as a charge on a capacitive element), and may decay over time. The memory cells may be organized into rows (word lines) and columns (bit lines), and the memory cells may be refreshed on a row-by-row basis. Repeated access to a particular row of memory (e.g., an aggressor row) may cause an increased rate of decay in neighboring rows (e.g., victim rows) due, for example, to electromagnetic coupling between the rows. In order to prevent information from being lost, it may be necessary to identify aggressor rows so that the corresponding victim rows can be refreshed to reduce information decay.

Row access operations may be monitored to determine which rows are aggressors or potential aggressors. For brevity, rows that are potential aggressors will also be referred to herein as aggressors or aggressor rows. In some applications, every access operation may be monitored to identify aggressor rows. For example, an aggressor row may be identified based on a number of accesses to a row within a given time period. In some applications, row hammer events may be identified by sampling accessed row addresses rather than monitoring every access. For example, a sample arming signal may be generated and each time the sample arming signal is activated, a current value of the row address on a row address bus may be sampled (e.g., latched). Aggressor row(s) may be identified based on one or more of the sampled row addresses. Using either technique, the identified aggressor rows may be used to calculate victim rows. The victim rows may be refreshed to reduce information decay. Circuitry used to identify aggressor rows, victim rows, and cause victim rows to be refreshed may be referred to collectively as row hammer refresh circuitry.

Memory arrays may be divided into portions referred to as banks. Circuits for certain functions may be provided for each bank. That is, each bank may have its own dedicated circuitry for a certain function. For example, each bank may have its own row hammer refresh circuitry. Thus, as the number of banks increases, the amount of row hammer refresh circuitry also increases, which may increase a layout area of the row hammer circuitry. Typically, circuits for each bank are provided in a location approximately equidistant to the different memory banks (e.g., proximate to the memory banks), sometimes referred to as the bank logic region. Placing circuitry for all of the memory banks in the bank logic region may reduce differences in signal times across the banks, which may make synchronization of memory operations easier. However, the bank logic region may be crowded with many circuits for many functions controlled at the bank level. Thus, increasing circuitry in the bank logic region may require increasing the size of a die including the memory array. Accordingly, it may be desirable to place circuits in another location on the die that is less congested and/or share circuits between banks.

FIG. 1 is a layout diagram of a semiconductor device according to an embodiment of the present disclosure. The layout diagram shows a layout of eight memory banks 118 (Bank0-7) of a semiconductor device 100. More or fewer banks may be included in the layout of other example embodiments. in a region proximate to the memory banks 118 is a bank logic region 103. One or more circuits for controlling memory operations of the banks 118 may be located in this region. For example, row decoders and/or column decoders for each bank 118 may be provided in the bank logic region 103. Typically, row hammer refresh circuitry, which may be components of a refresh control circuit (not shown in FIG. 1, see FIG. 2 for more details) for each bank may be provided in bank logic region 103. The bank logic region 103 may be a pitch area that is limited by the actual area size of transistors (e.g., AA limited). Accordingly, increasing the number of circuits in the bank logic region 103 may require increasing the size of the bank logic region 103, Which in turns may increase die size.

The semiconductor device 100 may include a central command region 105 in an area separate from the bank logic region 103. In some examples, the central command region 105 may be at or near a periphery of the semiconductor device 100. In some examples, the central command region 105 may be near or adjacent (e.g., proximate) to DQ pads (not shown in FIG. 1, see FIG. 2 for more details) of the semiconductor device 100. The central command region 105 may include circuits for controlling memory operations of the semiconductor device 100. For example, central command region 105 may include command address input circuits and/or IO circuits (not shown in FIG. 1, see FIG. 2 for more details). In some applications, the central command region 105 may be based, at least in part, on the size of the memory array and is not AA limited. Accordingly, there may be unused regions in the central command region 105 in some applications. Although the central command region 105 is shown at a periphery of a top portion of the semiconductor device 100 in FIG. 1, in other embodiments, the central command region 105 may be located in other areas of the semiconductor device 100.

According to embodiments of the present disclosure, at least some of the components of the row hammer refresh circuitry 107 may be located outside the bank logic region 103. For example, as shown in FIG. 1, at least some of the components of the row hammer refresh circuitry 107 may be located in the central command region 105 rather than in the bank logic region 103. In some applications, locating some components of the row hammer refresh circuitry 107 may permit one or more of the components to be shared across the banks. In sonic applications, this may reduce the congestion in the bank logic region 103 and/or reduce die size. in some applications, the timing requirements of row hammer refresh circuitry may be such that locating at least some of the components of the row hammer refresh circuitry 107 outside the bank logic region 103 may not have a detrimental effect on the row hammer refresh circuitry's performance.

Figure 2:
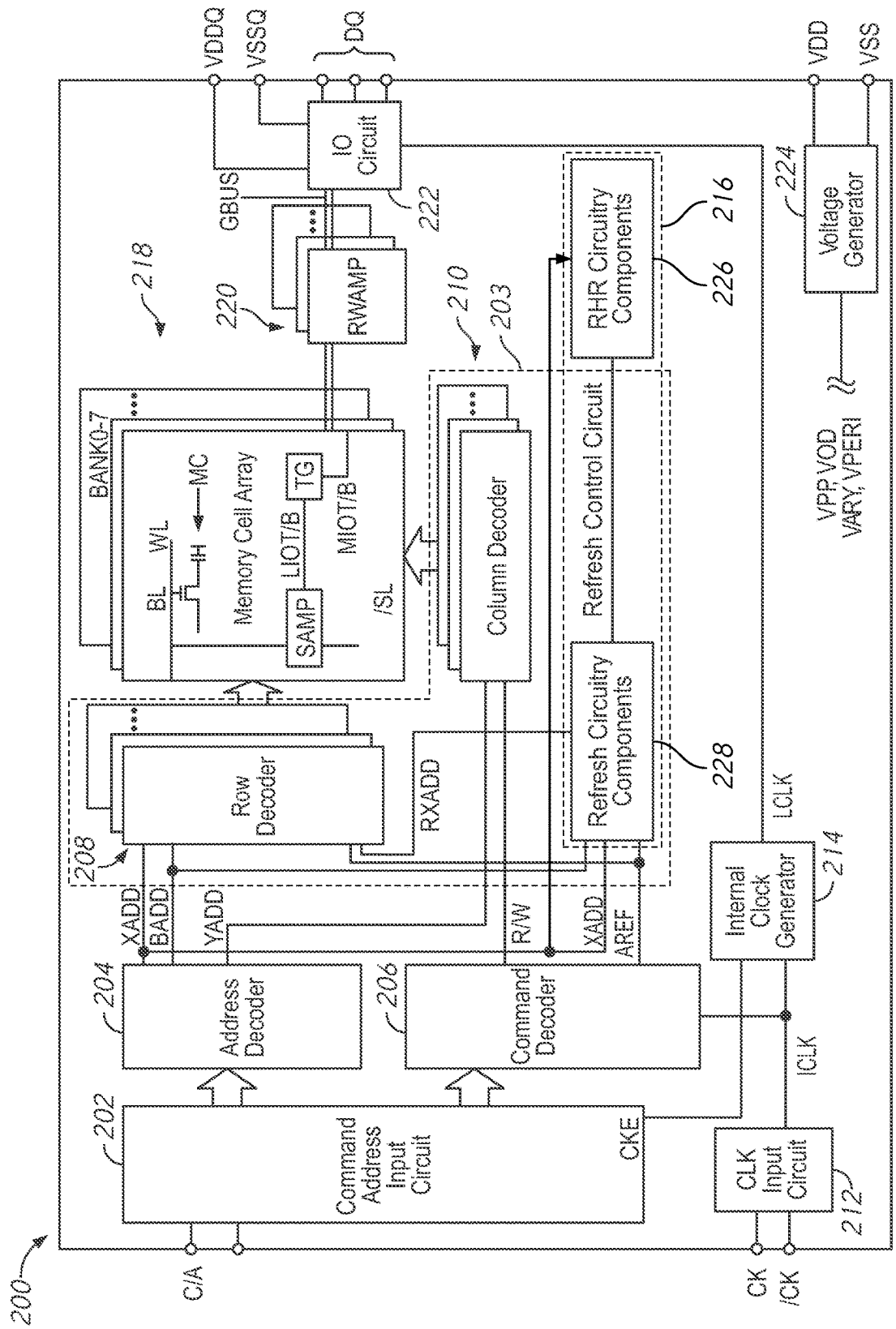
FIG. 2 is a block diagram of a semiconductor device according an embodiment of the disclosure.

FIG. 2 is a block diagram of a semiconductor device according an embodiment of the disclosure. The semiconductor device 200 may be a semiconductor memory device, such as a DRAM device integrated on a single semiconductor chip. In some embodiments, semiconductor device 200 may be included in semiconductor device 100. In some embodiments, semiconductor device 200 may have a layout as shown in the layout diagram shown in FIG. 1.

The semiconductor device 200 includes a memory array 218. The memory array 218 is shown as including a plurality of memory banks. In the embodiment of FIG. 2, the memory array 218 is shown as including eight memory banks BANK0-BANK7. In some embodiments, BANK0-7 may be included in Bank0-7 of FIG. 1. More or fewer banks may be included in the memory array 218 of other embodiments. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 208 and the selection of the bit lines BL and /BL is performed by a column decoder 210. In the embodiment of FIG. 2, the row decoder 208 includes a respective row decoder for each memory bank and the column decoder 210 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 220 over complementary local data lines (LIOT/B), transfer gate (TG), and complementary main data lines (MIOT/B). Conversely, write data outputted from the read/write amplifiers 220 is transferred to the sense amplifier SAMP over the complementary main data lines MOT/B, the transfer gate TG, and the complementary local data lines LIOT/B, and written in the memory cell MC coupled to the bit line BL or /BL.

The semiconductor device 200 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 212. The external clocks may be complementary. The input circuit 212 generates an internal clock ICLK based on the CK and /CK clocks. The ICLK clock is provided to the command decoder 210 and to an internal clock generator 214. The internal clock generator 214 provides various internal docks LCLK based on the ICLK dock. The LCLK clocks may be used for timing operation of various internal circuits. The internal data clocks LCLK are provided to the input/output circuit 222 to time operation of circuits included in the input/output circuit 222, for example, to data receivers to time the receipt of write data.

The C/A terminals may be supplied with memory addresses. The memory addresses supplied to the C/A terminals are transferred, via a command/address input circuit 202, to an address decoder 204. The address decoder 204 receives the address and supplies a decoded row address XADD to the row decoder 208 and supplies a decoded column address YADD to the column decoder 210. The address decoder 204 may also supply a decoded bank address BADD, which may indicate the bank of the memory array 218 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 206 via the command/address input circuit 202. The command decoder 206 includes circuits to decode the internal command signals to generate various internal signals and commands for performing operations. For example, the command decoder 206 may provide a row command signal to select a word line and a column command signal to select a bit line.

The device 200 may receive an access command which is a read command. When a read command is received, and a bank address, a row address and a column address are timely supplied with the read command, read data is read from memory cells in the memory array 218 corresponding to the row address and column address. The read command is received by the command decoder 206, which provides internal commands so that read data from the memory array 218 is provided to the read/write amplifiers 220. The read data is output to outside from the data terminals DQ via the input/output circuit 222.

The device 200 may receive an access command which is a write command. When the write command is received, and a bank address, a row address and a column address are timely supplied with the write command, write data supplied to the data terminals DQ is written to a memory cells in the memory array 218 corresponding to the row address and column address. The write command is received by the command decoder 206, which provides internal commands so that the write data is received by data receivers in the input/output circuit 222. Write clocks may also be provided to the external clock terminals for timing the receipt of the write data by the data receivers of the input/output circuit 222. The write data is supplied via the input/output circuit 222 to the read/write amplifiers 220, and by the read/write amplifiers 220 to the memory array 218 to be written into the memory cell MC.

The device 200 may also receive commands causing it to carry out one or more refresh operations as part of a self-refresh mode. In some embodiments, the self-refresh mode command may be externally issued to the memory device 200. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 206 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop.

The refresh signal AREF is supplied to the refresh control circuit 216. The refresh control circuit 216 supplies a refresh row address RXADD to the row decoder 208, which may refresh one or more wordlines WE indicated by the refresh row address RXADD. In some embodiments, the refresh address RXADD may represent a single wordline. In some embodiments, the refresh address RXADD may represent multiple wordlines, which may be refreshed sequentially or simultaneously by the row decoder 208. in some embodiments, the number of wordlines represented by the refresh address RXADD may vary from one refresh address to another. The refresh control circuit 216 may control a timing of the refresh operation, and may generate and provide the refresh address RXADD. The refresh control circuit 216 may be controlled to change details of the refreshing address RXADD (e.g., how the refresh address is calculated, the timing of the refresh addresses, the number of wordlines represented by the address), or may operate based on internal logic.

The refresh control circuit 216 may selectively output a targeted refresh address (e.g., a victim address) or an automatic refresh address (auto-refresh address) as the refresh address RXADD. The automatic refresh addresses may be from a sequence of addresses which are provided based on activations of the refresh signal AREF. The refresh control circuit 216 may cycle through the sequence of auto-refresh addresses at a rate determined by AREF. In some embodiments, the auto-refresh operations may generally occur with a timing such that the sequence of auto-refresh addresses is cycled such that no information is expected to degrade in the time between auto-refresh operations for a given wordline. In other words, auto-refresh operations may be performed such that each wordline is refreshed at a rate faster than the expected rate of information decay.

The refresh control circuit 216 may also determine targeted refresh addresses which are addresses that require refreshing (e.g., victim addresses corresponding to victim rows) based on the access pattern of nearby addresses (e.g., aggressor addresses corresponding to aggressor rows) in the memory array 218. The refresh control circuit 216 may use one or more signals of the device 200 to calculate the targeted refresh address RXADD. For example, the refresh address RXADD may be a calculated based on the row addresses XADD provided by the address decoder. The refresh control circuit 216 may sample the current value of the row address XADD provided by the address decoder 204 along a row address bus, and determine a targeted refresh address based on one or more of the sampled addresses.

While in general the present disclosure refers to determining aggressor and victim wordlines and addresses, it should be understood that as used herein, an aggressor wordline does not necessarily need to cause data degradation in neighboring wordlines, and a victim wordline does not necessarily need to be subject to such degradation. The refresh control circuit 216 may use some criteria to judge whether an address is an aggressor address, which may capture potential aggressor addresses rather than definitively determining which addresses are aggressors. For example, the refresh control circuit 216 may determine potential aggressor addresses based on a pattern of accesses to the addresses and this criteria may include some addresses which are not aggressors, and miss some addresses which are. Similar victim addresses may be determined based on which wordlines are expected to be effected by aggressors, rather than a definitive determination of which wordlines are undergoing an increased rate of data decay.

The refresh address RXADD may be provided with a timing based on a timing of the refresh signal AREF. The refresh control circuit 216 may have time slots corresponding to the timing of AREF, and may provide one or more refresh addresses RXADD during each time slot. In some embodiments, the targeted refresh address may be issued in (e.g., "steal") a time slot which would otherwise have been assigned to an auto-refresh address. In some embodiments, certain time slots may be reserved for targeted refresh addresses, and the refresh control circuit 216 may determine whether to provide a targeted refresh address, not provide an address during that time slot, or provide an auto-refresh address instead during the time slot.

The targeted refresh address may be based on characteristics over time of the sampled row addresses XADD received from the address decoder 204. The refresh control circuit 216 may sample the current row address XADD as it is provided on the row address bus to determine its characteristics over time. The sampling may occur intermittently, with each sample acquired based on a random or semi-random timing. The refresh control circuit 216 may use different methods to calculate a targeted refresh address based on the sampled row address XADD. For example, the refresh control circuit 216 may determine if a given row is an aggressor address, and then calculate and provide addresses corresponding to victim addresses of the aggressor address as the targeted refresh address. In some embodiments, more than one victim address may correspond to a given aggressor address. In this case the refresh control circuit may queue up multiple targeted refresh addresses, and provide them sequentially when it determines that a targeted refresh address should be provided. The refresh control circuit 216 may provide the targeted refresh address right away, or may queue up the targeted refresh address to be provided at a later time (e.g., in the next time slot available for a targeted refresh).

As shown in FIG. 2, at least some of the refresh control circuit 216 may be included in a bank logic region 203 of the semiconductor device 200. In some embodiments, bank logic region 203 may correspond to bank logic region 103 shown in FIG. 1. The circuitry components of the refresh control circuit 216 located in the bank logic region 203 are shown as refresh circuitry components 228. According to embodiments of the present disclosure, some of the RHR circuitry components 226 of the refresh control circuit 216 may be located in a region separate from the bank logic region 203. For example, a central command region (e.g., central command region 105 in FIG. 1), near IO circuit 222 and/or DQ pads. In some embodiments, the RHR circuitry components 226 may include circuits for determining the aggressor row addresses from row addresses XADD and provide the aggressor row addresses to the refresh circuitry components 228. In some applications, locating at least some of the RHR circuitry components 226 outside the bank logic region 203 may prevent an increase in die size and/or reduce die size.

The power supply terminals are supplied with power supply potentials VDD and VSS. The power supply potentials VDD and VSS are supplied to an internal voltage generator circuit 224. The internal voltage generator circuit 224 generates various internal potentials VPP, VOD, VARY, VPERI, and the like based on the power supply potentials VDD and VSS supplied to the power supply terminals. The internal potential VPP is mainly used in the row decoder 208, the internal potentials VOD and VARY are mainly used in the sense amplifiers SAW included in the memory array 218, and the internal potential VPERI is used in many peripheral circuit blocks.

The power supply terminals are also supplied with power supply potentials VDDQ and VSSQ. The power supply potentials VDDQ and VSSQ are supplied to the input/output circuit 222. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 222 so that power supply noise generated by the input/output circuit 222 does not propagate to the other circuit blocks.

Figure 3:
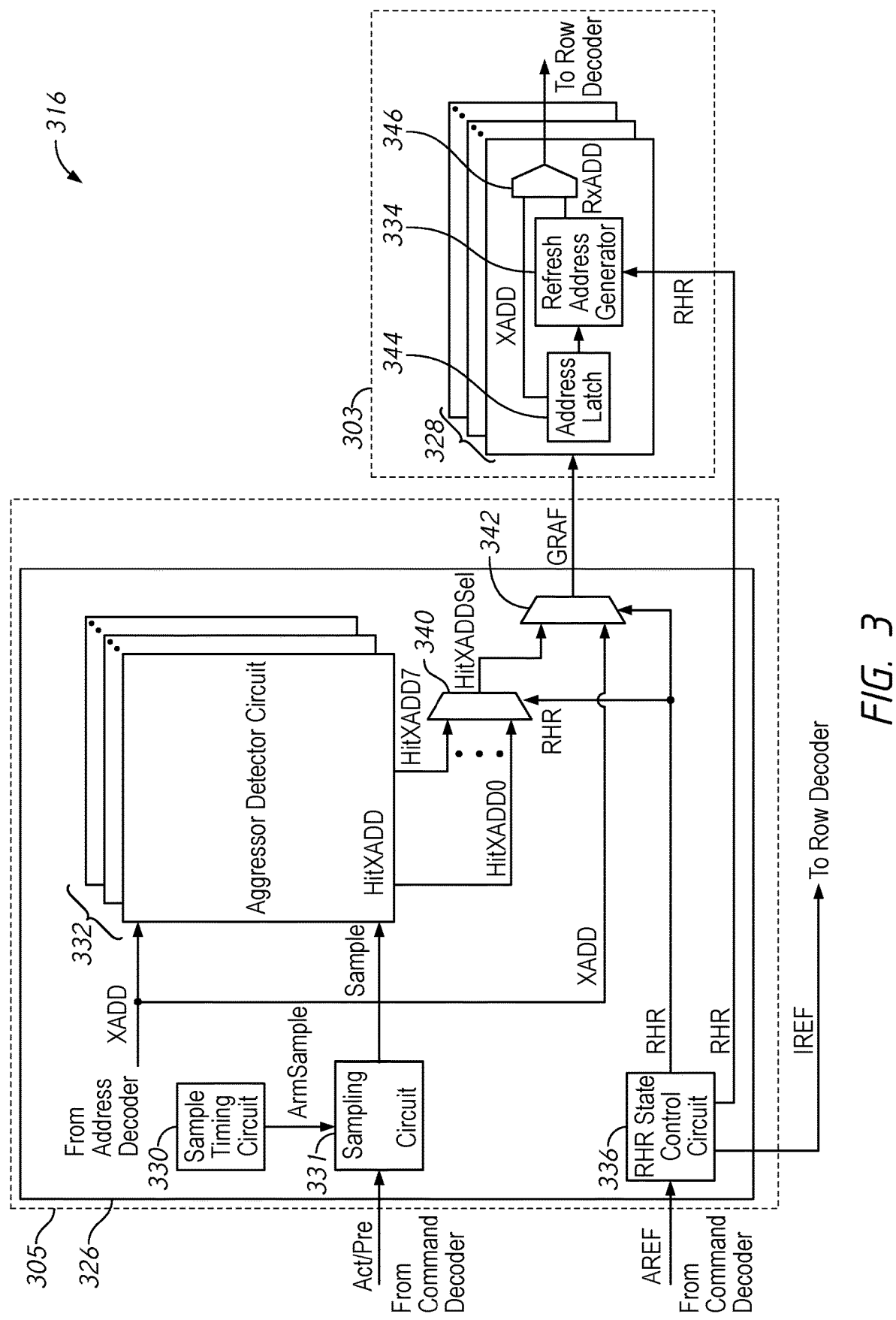
FIG. 3 is a block diagram of a refresh control circuit according to an embodiment of the present disclosure.

FIG. 3 is a block diagram of a refresh control circuit according to an embodiment of the present disclosure. The refresh control circuit 316 may, in some embodiments, be included in the refresh control circuit 216 of FIG. 2. Certain internal components and signals of the refresh control circuit 316 are shown to illustrate the operation of the refresh control circuit 316. The refresh control circuit 316 may include a sample timing circuit 330, a sampling circuit 331, an aggressor detector circuit 332, a row hammer refresh (RHR) state control circuit 336 and a refresh address generator 334. The refresh control circuit 316 may receive one or more signals from a command decoder (e.g., command decoder 206), such as a refresh signal AREF and access signals such as an activation signal ACT and a pre-charge signal Pre. The refresh signal AREF may be a periodic signal which may indicate when an auto-refresh operation is to occur. The access signals ACT and Pre may generally be provided as part of an access operation along with a row address XADD. The activation signal ACT may be provided to activate a given bank of the memory. The pre-charge signal Pre may be provided to pre-charge the given bank of the memory. The refresh control circuit 316 may receive a row address XADD from an address decoder (e.g., address decoder 204). The row address XADD may be a signal including multiple bits (which may be transmitted in series or in parallel) and may correspond to a specific row of an activated memory bank. The refresh control circuit 316 provides refresh address RXADD, for example, to a row decoder (e.g. row decoder 208), with timing based on the refresh signal AREF, wherein some of the refresh addresses are based on the received row address XADD.

As shown in FIG. 3, some of the components of the refresh control circuit 316 may be located in a separate region 305 outside a bank logic region 303. In some embodiments, the separate region 305 may correspond to the central command region 105 and the bank logic region 303 may correspond to bank logic region 103. In some embodiments, the components of the refresh control circuit 316 located in separate region 305 may include RHR circuitry components 326. In the example shown in FIG. 3, the sample timing circuit 330, the sampling circuit 331, the aggressor detector circuit 332, and the RHR control circuit 336 are located in the separate region 305. In some embodiments, RHR circuitry components 326 included in the separate region 305 may be provided for each memory bank included in a semiconductor device including refresh control circuit 316. In some embodiments, some or all of the components of the RHR circuitry components 326 may be shared across multiple memory banks. In the example shown in FIG. 3, the sample timing circuit 330, the sampling circuit 331, and the RHR control circuit 336 are shared across all of the banks. As indicated by the multiple boxes, an aggressor detector circuit 332 may be provided for each bank.

In some embodiments, the aggressor detector circuit 332 may sample the current row address XADD responsive to an activation a sampling signal Sample. In some embodiments, the sampled addresses may be stored in the aggressor circuit 332 and/or compared to previously stored addresses. The aggressor detector circuit 332 may a match address HitXADD based on a currently sampled row address XADD and/or previously sampled row addresses. The RHR state control circuit 336 may provide the signal RHR to indicate that a row hammer refresh (e.g., a refresh of the victim rows corresponding to an identified aggressor row) should occur. The RHR state control circuit 336 may also provide an internal refresh signal IREF, to indicate that an auto-refresh should occur. Responsive to an activation of RHR or IREF, the refresh address generator 334 may provide a refresh address RXADD, which may be an auto-refresh address or may be one or more victim addresses corresponding to victim rows of the aggressor row corresponding to the match address HitXADD. The row decoder may perform a refresh operation responsive to the refresh address RXADD and the row hammer refresh signal RHR. The row decoder may perform an auto-refresh operation based on the refresh address RXADD and the internal refresh signal IREF.

In embodiments where row accesses are monitored by sampling (in contrast to monitoring every access operation) the sample timing circuit 330 provides the sample arming signal ArmSample. The signal ArmSample may be a binary signal which can be at a high logical level (which may be represented by a first voltage, such as VDD) or at a low logical level (which may be represented by a second voltage, such as ground or VSS). An activation of ArmSample may be a 'pulse', where ArmSample is raised to a high logic level and then returns to a low logic level. The sample timing circuit 330 may have a probability of providing an activation of ArmSample.

The sampling circuit 331 may receive the sample arming signal ArmSample along with the access signals ACT and Pre. Based on these signals, the sampling circuit 331 may provide activations of the sampling signal Sample. The sampling circuit 331 may use one or both of the signals ACT and Pre to ensure that each activation of the signal Sample is associated with an access operation. The sampling circuit 331 may randomly determine when (and/or how) to provide one or more activations of the signal Sampling responsive to the signals ACT/Pre and ArmSample. In other examples, the sampling circuit 331 may activate the signal Sampling in a partially random or non-random manner.

The aggressor detector circuit 332 may receive the row address XADD from the address decoder and the signal Sample from the sampling circuit 331. The row address XADD on the row address bus may change as the address decoder and command decoder direct access operations (e.g., read and write operations) to different rows of the memory cell array (e.g., memory cell array 218 of FIG. 2). Each time the aggressor detector circuit 332 receives an activation (e.g., a pulse) of the signal Sample, the aggressor detector circuit 332 may sample the current value of XADD. In sonic embodiments, the aggressor detector circuit 332 may provide the currently sampled value of XADD as the match address HitXADD. As will be described in more detail herein, the refresh address generator 334 may provide one or more victim addresses associated with the match address HitXADD as the refresh address RXADD.

In some embodiments, responsive to an activation of the sampling signal Sample, the aggressor detector circuit 332 may determine if one or more rows is an aggressor row based on the sampled row address XADD, and may provide identified aggressor rows as the match address HitXADD. As part of this determination, the aggressor detector circuit 332 may record (e.g., by latching in a register and/or otherwise storing) the current value of XADD responsive to the activation of Sample. The current value of XADD may be compared to previously recorded addresses in the aggressor detector circuit 332 (e.g., the addresses stored in the latch/register), to determine access patterns over time of the sampled addresses. If the aggressor detector circuit 332 determines that an address (which, in some embodiments, may be either the current address or a previously stored address) aggressor address, then the identified aggressor may be provided as a match address HitXADD. In some embodiments, the match address HitXADD may be provided responsive to the signal Sampling. In some embodiments, the match address (e.g., aggressor address) HitXADD may be stored in a latch circuit for later retrieval by the refresh address generator 334 when the refresh address generator 334 determines a match address is needed.

In one example embodiment, in order to determine if the current address XADD is an aggressor address, the sampled value of the current row address XADD may be stored (e.g., latched in a latch circuit). The activation of Sample may also cause the aggressor detector circuit 332 to compare the currently sampled row address XADD to the previously stored addresses in the aggressor detector circuit 332. If the current row address XADD matches a stored address, the current row address XADD may be provided as the match address HitXADD.

In another example embodiment, the aggressor detector circuit 332 may store the value of sampled addresses in a register, and may have a counter associated with each of the stored addresses. When Sample is activated, if the current row address XADD matches one of the stored addresses, the value of the counter may be incremented. Responsive to the activation of Sample, the aggressor detector circuit 332 may provide the address associated with the highest value counter as the match address HitXADD. Other methods of identifying aggressor addresses may be used in other examples.

In embodiments where every row access command is monitored, the sample timing circuit 330 and sampling circuit 331 may be omitted. In these embodiments, the aggressor detector circuit 332 may perform the functions above responsive to the ACT/Pre signal rather than the Sample signal.

The RHR state control circuit 336 may receive the refresh signal AREF and provide the row hammer refresh signal RHR. The refresh signal AREF may be periodically generated and may be used to control the timing of refresh operations. The memory device may carry out a sequence of auto-refresh operations in order to periodically refresh the rows of the memory device. The RHR signal may be generated in order to indicate that the device should refresh a particular targeted row (e.g., a victim row) instead of an address from the sequence of auto-refresh addresses. The RHR state control circuit 336 may use internal logic to provide the RHR signal. In some embodiments, the state control circuit 336 may provide the RHR signal based on certain number of activations of AREF (e.g., every $4^{th}$ activation of AREF). In some embodiments, the RHR state control circuit 336 may provide a number of activations of the signal RHR in a row based on a number of victim wordlines associated with an aggressor wordline. The RHR state control circuit 336 may also provide an internal refresh signal IREF, which may indicate that an auto-refresh operation should take place. In some embodiments, the signals RHR and IREF may be generated such that they are not active at the same time (e.g., are not both at a high logic level at the same time).

In some embodiments, the refresh control circuit 316 may perform multiple refresh operations responsive to each activation of the refresh signal AREF. For example, each time the refresh signal AREF is received, the refresh control circuit 316 may perform N different refresh operations, by providing N different refresh addresses RXADD. Each refresh operation may be referred to as a 'pump'. In some embodiments, the refresh control circuit 316 may have a fixed pattern where some pumps are assigned to auto-refresh operation and some pumps are assigned to targeted refresh operations. In some embodiments, the refresh control circuit 316 may dynamically determine whether a given pump is associated with an auto-refresh operation, a targeted refresh operation, or no refresh operation.

In some embodiments, such as the one shown in FIG. 3, refresh control circuitry components 328 of refresh control circuit 316 may be included in bank logic region 303 of the semiconductor device including the refresh control circuit 316. In the example shown in FIG. 3, the refresh address generator 334 may be included in the bank logic region 303. As indicated multiple boxes, the refresh control circuitry components 328, such as refresh address generator 334, may be provided for each memory bank in some embodiments.

The refresh address generator 334 may receive the row hammer refresh signal RHR and the match address HitXADD. The match address HitXADD may represent an aggressor row. The refresh address generator 334 may determine the locations of one or more victim rows based on the match address HitXADD and provide them as the refresh address RXADD when the signal RHR indicates a targeted refresh operation. In some embodiments, the victim rows may include rows which are physically adjacent to the aggressor row (e.g., HitXADD+1 and HitXADD−1). In some embodiments, the victim rows may also include rows which are physically adjacent to the physically adjacent rows of the aggressor row (e.g., HitXADD+2 and HitXADD−2). Other relationships between victim rows and the identified aggressor rows may be used in other examples. For example, +/−3, +/−4, and/or other rows may also be refreshed.

The refresh address generator 334 may determine the value of the refresh address RXADD based on the row hammer refresh signal RHR. In some embodiments, when the signal RHR is not active, the refresh address generator 334 may provide one of a sequence of auto refresh addresses. When the signal RHR is active, the refresh address generator 334 may provide a targeted refresh address, such as a victim address, as the refresh address RXADD. In some embodiments, the refresh address generator 334 may count activations of the signal RHR, and may provide closer victim rows (e.g., HitXADD+/−1) more frequently than victim rows which are further away from the aggressor address (e.g., HitXADD+/−2).

In the example shown in FIG. 3, the semiconductor device including refresh control circuit 316 includes a memory array divided into eight banks. Accordingly, the refresh control circuit 316 may include eight aggressor detector circuits 332 and eight refresh address generators 334. The aggressor detector circuits 332 may provide match addresses HitXADD0-7, respectively. When the aggressor detector circuits 332 are located in a separate region 305 from the refresh address generators 334 in the bank logic region 303, additional control logic may be used to route the match addresses HitXADD0-7 to the appropriate refresh address generators 334. For example, in some embodiments, such as the one shown in FIG. 3, multiplexer 340 may be included to provide the appropriate match address of HitXADD0-7 to the refresh address generators 334.

The multiplexer 340 may receive the match address for each bank (HitXADD0-7). Refresh operations may be performed on a single bank or multiple banks, such as all of the banks during an all-bank refresh operation. In some applications, one or more rows in multiple banks may be simultaneously refreshed. In other applications, to reduce peak current draw, the refreshing of the one or more rows in the multiple banks may be staggered over time, (e.g., refreshed in a time-staggered manner). For performing a targeted refresh operation on a single bank, only one address of the match addresses HitXADD0-7 is provided for the bank being refreshed as HitXADDSel. However, during an all-bank refresh operation where a targeted refresh operation is to be performed, the victim row(s) to be refreshed for each bank of the semiconductor device may be different. Accordingly, a match address for each bank may be provided. The multiplexer 340 may output the different match addresses HitXADD0-7 as HitXADDSel at different times responsive to the RHR signal from the RHR control circuit 336. The multiplexer 340 may output the selected match address HitXADDSel to another multiplexer 342.

The multiplexer 342 may be used to provide either the HitXADDSel from the separate region 305 or the row address XADD to the refresh address generators 334. The HitXADDSel or XADD may be output from second multiplexer 342 as row address signal GRAF. Whether HitXADDSel or row address XADD is output by multiplexer 342 as row address GRAF, based on whether or not a targeted refresh address is performed. For example, when the RHR signal is active, HitXADDSel may be provided as GRAF and when the RHR signal is inactive, XADD may be provided as GRAF.

In some embodiments, the refresh circuitry components 328 may include an address latch 344 to provide the row address GRAF to the refresh address generator 334. During a targeted refresh operation, the address latch 344 of the bank logic region 303 may latch GRAF. The address latch 344 may provide the latched address to the refresh address generator 334, which may use the latched address to determine a refresh address RXADD as described herein. in some applications, the address latch 344 may increase timing tolerance for providing row address signals from the separate region 305 to the bank logic region 303 and/or performing RHR operations. In some embodiments, the refresh circuitry components 328 may include multiplexer 346 that receives XADD from the address latch 344 and RXADD from the refresh address generator 334. The multiplexer 346 may output either XADD or RXADD based on whether or not a refresh command has been received. The output of multiplexer 346 may be provided to a row decoder in some embodiments.

The row decoder may perform one or more operations on the memory array (not shown) based on the received signals and addresses. For example, responsive to the activation signal ACT and the row address XADD (and IREF and RHR being at a low logic level), the row decoder may direct one or more access operations (for example, a read operation) on the specified row address XADD. Responsive to the RHR signal being active, the row decoder may refresh the refresh address RXADD.

Figure 4:
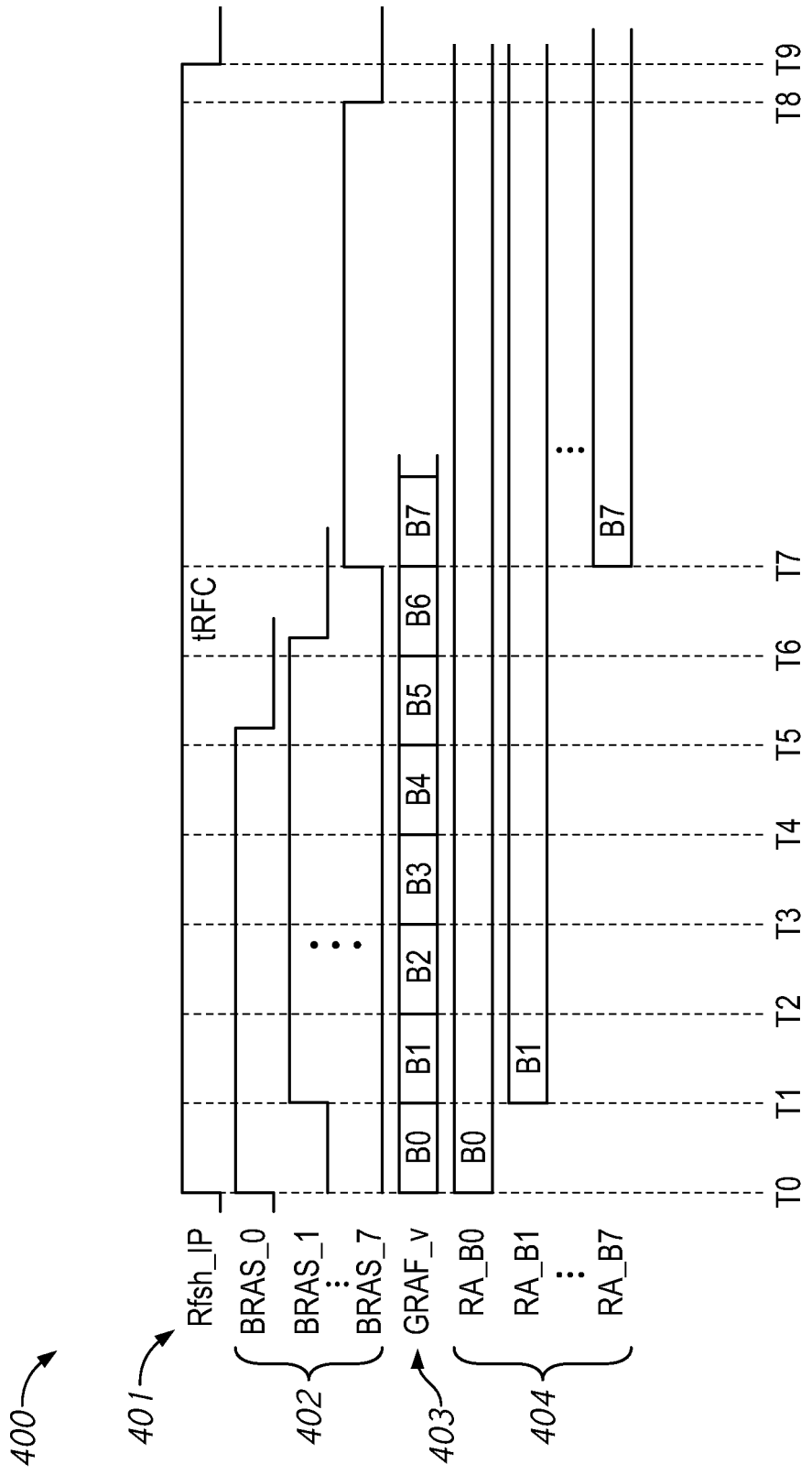
FIG. 4 is a timing diagram according to an embodiment of the present disclosure.

FIG. 4 is a timing diagram according to an embodiment of the present disclosure. The timing diagram 400 illustrates the states of various signals during an all-bank refresh operation when a targeted refresh operation is to be performed. In some embodiments, the timing diagram 400 may illustrate the states of various signals of a semiconductor device, such as semiconductor device 200, which may include refresh control circuit 316 in some examples.

The first line of timing diagram 400 indicates a period in which a refresh operation, such as an all-bank refresh operation occurs. The length of the period may be based, at least in part, on specifications of the semiconductor device. The next lines 402 indicate the status of bank refresh signals (BRAS_0-7). The bank refresh signals BRAS0-7 may transition from an inactive state (e.g., low logic) to an active state (e.g., high logic) when a memory bank of the semiconductor device is to begin performing a refresh operation and may transition back to the inactive state after the refresh operation. As shown in FIG. 4, the bank refresh signals may transition from the inactive to the active state in a time-staggered manner. In other words, during an all-bank refresh operation, not all of the banks may perform refresh operations at the same time. In some applications, the staggering may reduce current draw by the semiconductor device.

Line 403 indicates a match address provided at the output of a multiplexer, such as multiplexer 340 and/or 342. Lines 404 indicate the address provided to a refresh address generator, such as refresh address generator 334, by an address latch, such as address latch 344. As shown in FIG. 4, the match address for bank 0 (B0) may be provided by the multiplexer at or around T0, which may be at or around the same time BRAS_0 transitions to an active state, At or around the same time the match address B0 is provided by the multiplexer, the match address B0 may be latched and provided to the refresh address generator. Similarly, the match address for bank 1 (B1) may be provided at or around time T1 When the BRAS_1 signal transitions to an active state causing an address latch for bank 1 to latch the address B1. This may continue until match addresses have been provided and latched for all of the banks of the semiconductor device.

The latched addresses B0-7 may be used to seed the refresh address generator of each bank to generate refresh addresses. In some embodiments, these addresses may correspond to victim rows of aggressor rows in the corresponding memory bank.

Figure 5:
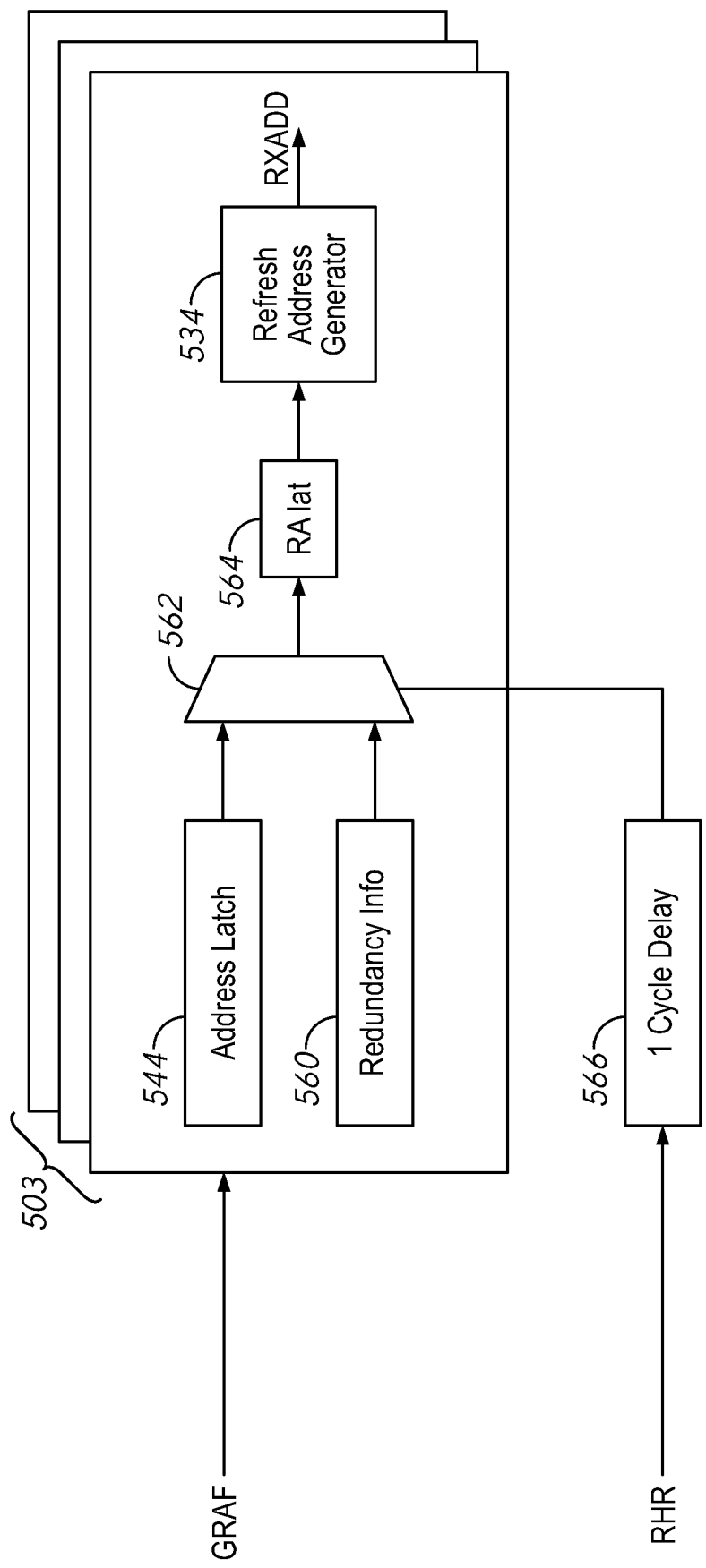
FIG. 5 is a block diagram of a portion of a refresh control circuit according to an embodiment of the disclosure.

FIG. 5 is a block diagram of a portion of a refresh control circuit according to an embodiment of the disclosure. In some embodiments, the refresh control circuit 516 may be included in refresh control circuit 216 and/or 316.

In some applications, memory banks of a semiconductor device that includes refresh control circuit 516 may include extra rows. These extra rows may be used to replace faulty rows in the memory bank. This is sometimes referred to as redundancy. When an extra row is used to replace a row in a memory bank, the address of the row is mapped to the extra row. This mapping may be performed by programing fuses and/or antifuses. The redundancy information 560 stored in the fuses and/or antifuses may be located in a bank logic region 503 of the semiconductor device. In some applications, the redundancy information 560 may not be readily available to circuitry in a separate region from the bank logic region 503 (e.g., central command region not shown in FIG. 5) of the semiconductor device. Accordingly, the match address for a bank (GRAF) provided by row hammer refresh circuitry located in the separate region (e.g., RHR circuitry components 226, 326) may need to be corrected if a row has been replaced by an extra row.

As shown in FIG. 5 a row address GRAF may be received from row hammer refresh circuitry (e.g., multiplexer 342 shown in FIG. 3) and stored by address latch 544. The latched address may be compared to redundancy information 560 to see if the row indicated by the latched address has been replaced by an extra row. If the redundancy information 560 does not indicate the row associated with the latched address has been replaced, multiplexer 562 may output the originally received GRAF address to a row address latch 564, which provides the address to a refresh address generator 534. If the redundancy information 560 does indicate the row associated with the latched address has been replaced by an extra row, multiplexer 562 may output an address associated with the extra row (e.g., extra row address) used to replace the original row based, at least in part on the redundancy information 560. The extra row address may be latched by the row address latch 564 and provided to the refresh address generator 534. Based on either the GRAF address or the extra row address, the refresh address generator 534 may output a refresh address RXADD.

Optionally, in some embodiments, to ensure enough time is provided to make the comparison between the latched address and the redundancy information 560, a one refresh cycle delay 566 may be added. This may delay the output of a refresh address for a targeted refresh address until a next targeted refresh operation.

As described herein, including at least some components of the row hammer refresh circuitry of a refresh control circuit in a region of a semiconductor device outside the bank logic region may reduce die size requirements by taking advantage of less congested areas of the semiconductor device. In some applications, locating the components outside the, bank logic may allow some of the row hammer refresh circuitry components to be shared, which may further reduce die size requirements.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   a plurality of memory banks;
   a bank logic region located centrally to the plurality of memory banks;
   a second region separate from the bank logic region;
   an aggressor detector circuit located in the second region, wherein the aggressor detector circuit is configured to generate a match address corresponding to an aggressor row; and
   a refresh address generator located in the bank logic region, wherein the refresh address generator is configured to generate a refresh address based, at least in part, on the match address.

2. The apparatus of claim 1, further comprising a plurality of aggressor detector circuits, wherein a number of the plurality of aggressor detector circuits corresponds to a number of the plurality of memory banks.

3. The apparatus of claim 2, further comprising a plurality of refresh address generators, wherein a number of the plurality of refresh address generators corresponds to the number of the plurality of memory banks.

4. The apparatus of claim 3, further comprising a multiplexer configured to receive a plurality of match addresses from the plurality of aggressor detector circuits and output individual ones of the plurality of match addresses in a time-staggered manner.

5. The apparatus of claim 4, further comprising a plurality of address latches, wherein each address latch is configured to latch one of the individual ones of the plurality of match addresses and provide a latched address to a corresponding one of the plurality of refresh address generators.

6. The apparatus of claim 1, further comprising row redundancy information and a multiplexer located in the bank logic region, wherein the match address is compared to the row redundancy information,
   wherein the multiplexer provides a new address to the refresh address generator based on the row redundancy information when the row redundancy information indicates a row associated with the match address has been replaced by an extra row, and the multiplexer provides the match address when the row redundancy information indicates the row associated with the match address has not been replaced by the extra row.

7. The apparatus of claim 6, wherein the row redundancy information includes at least one of a fuse or an antifuse.

8. The apparatus of claim 1, further comprising a row hammer refresh state control circuit and a sampling circuit located in the second region.

9. The apparatus of claim 8, further comprising a plurality of aggressor detector circuits, wherein a number of the plurality of aggressor detector circuits corresponds to a number of the plurality of memory banks, wherein the sampling circuit is coupled to multiple ones of the plurality of aggressor detector circuits.

10. The apparatus of claim 1, further comprising a multiplexer configured to receive the match address and a row address, wherein the multiplexer is configured to output the match address responsive to an active row hammer refresh signal and output the row address responsive to an inactive row hammer refresh signal provided by a row hammer refresh state control circuit.

11. The apparatus of claim 1, further comprising DQ pads configured to receive and provide data, wherein the second region is proximate to the DQ pads.

12. A method comprising:
monitoring row access operations for a plurality of memory banks with a corresponding plurality of aggressor detector circuits;
generating, with the plurality of aggressor detector circuits, a plurality of match addresses, each of the plurality of match addresses corresponding to one of the plurality of memory banks;
responsive to an all-bank targeted refresh command, providing the plurality of match addresses from the aggressor detector circuits to a multiplexer; and
outputting individual ones of the plurality of match addresses from the multiplexer in a time-staggered manner.

13. The method of claim 12, further comprising latching individual ones of the plurality of match addresses by a plurality of address latches, wherein each one of the plurality of address latches is associated with a corresponding one of the plurality of memory banks.

14. The method of claim 12, further comprising:
generating refresh addresses based on individual ones of the plurality of match addresses, wherein each refresh address is associated with a different one of the plurality of memory banks; and
refreshing rows associated with the refresh addresses in a time-staggered manner.

15. The method of claim 14, wherein the refresh addresses are generated by a plurality of refresh address generators located in a bank logic region of a memory device and the plurality of aggressor detector circuits are located in a second region of the memory device separate from the bank logic region.

16. The method of claim 12, wherein the monitoring is performed responsive to a sample signal provided by a sampling circuit coupled to the plurality of aggressor detector circuits.

17. A memory device comprising:
a plurality of memory banks; and
a refresh control circuit comprising refresh circuitry components located in a bank logic region located central to the plurality of memory banks and row hammer refresh (RHR) circuitry components located in a second region separate from the bank logic region.

18. The memory device of claim 17, wherein the refresh circuitry components comprise a plurality of address latches and a plurality of refresh address generators coupled to corresponding ones of the plurality of address latches, wherein a number of the plurality of address latches and a number of the plurality of refresh address generators corresponds to a number of the plurality of memory banks.

19. The memory device of claim 17, wherein the RHR circuitry components comprise a plurality of aggressor detector circuits, wherein a number of the plurality of aggressor detector circuits corresponds a number of the plurality of banks.

20. The memory device of claim 19, wherein the RHR circuitry components further comprises:
a sampling circuit coupled to multiple ones of the plurality of aggressor detector circuits; and
a RHR state control circuit.

* * * * *